US012658905B2

(12) United States Patent
Saari et al.

(10) Patent No.: US 12,658,905 B2
(45) Date of Patent: Jun. 16, 2026

(54) HIGH VOLTAGE TOLERANT BOOTSTRAP SWITCH

(71) Applicant: Analog Devices International Unlimited Company, County Limerick (IE)

(72) Inventors: Daniel Saari, Gloucester (CA); Daniel Boyko, Norwood, MA (US)

(73) Assignee: ANALOG DEVICES INTERNATIONAL UNLIMITED COMPANY, Co. Limerick (IE)

( * ) Notice: Subject to any disclaimer, the term of this patent is extended or adjusted under 35 U.S.C. 154(b) by 0 days.

(21) Appl. No.: 18/660,585

(22) Filed: May 10, 2024

(65) Prior Publication Data

US 2025/0141442 A1 May 1, 2025

Related U.S. Application Data

(60) Provisional application No. 63/594,169, filed on Oct. 30, 2023.

(51) Int. Cl.
| | |
|---|---|
| *H03K 17/00* | (2006.01) |
| *H03K 17/06* | (2006.01) |
| *H03K 17/082* | (2006.01) |
| *H03K 17/10* | (2006.01) |

(52) U.S. Cl.
CPC ....... *H03K 17/063* (2013.01); *H03K 17/0822* (2013.01); *H03K 17/102* (2013.01)

(58) Field of Classification Search
CPC ............. H03K 17/063; H03K 17/0822; H03K 17/102; H03K 17/08122; H03K 2217/0054
See application file for complete search history.

(56) References Cited

U.S. PATENT DOCUMENTS

| | | | | |
|---|---|---|---|---|
| 4,590,396 A | * | 5/1986 | Koike | H10D 84/85 |
| | | | | 326/98 |
| 4,974,142 A | | 11/1990 | Leslie | |
| 6,567,024 B1 | | 5/2003 | Ishikawa | |
| 6,856,177 B1 | | 2/2005 | De Frutos et al. | |
| 7,397,284 B1 | * | 7/2008 | Liu | H03K 19/018528 |
| | | | | 326/88 |

(Continued)

OTHER PUBLICATIONS

Extended European Search Report for International Application No. 24178663.1 dated Nov. 13, 2024 in 9 pages.

(Continued)

*Primary Examiner* — Tuan T Lam
(74) *Attorney, Agent, or Firm* — Knobbe, Martens, Olson & Bear, LLP

(57) ABSTRACT

Apparatus and methods for high voltage tolerant bootstrap switches are disclosed. In certain embodiments, an integrated circuit (IC) includes an input node that receives an input voltage, an output node, and a switch connected between the input node and the output node. The switch includes a first field-effect transistor (FET) and a second FET electrically connected in series between the input node and the output node. The switch is configurable between an OFF state in which a gate of the first FET is controlled with a first voltage and a gate of the second FET is controlled with a second voltage, and an ON state in which the gates of the first FET and the second FET are controlled with a voltage that tracks the input voltage.

20 Claims, 5 Drawing Sheets

(56)  References Cited

U.S. PATENT DOCUMENTS

| | | | | |
|---|---|---|---|---|
| 7,813,093 | B2 | 10/2010 | Boyko et al. | |
| 7,924,540 | B2 * | 4/2011 | Tamegai | H02J 7/00308 |
| | | | | 361/91.1 |
| 7,969,243 | B2 * | 6/2011 | Bracale | H10D 84/40 |
| | | | | 330/277 |
| 8,183,890 | B1 * | 5/2012 | Oo | G11C 27/024 |
| | | | | 327/427 |
| 8,212,604 | B2 * | 7/2012 | Dianbo | H03K 17/063 |
| | | | | 327/434 |
| 8,461,905 | B2 | 6/2013 | Krauss | |
| 8,525,574 | B1 | 9/2013 | Duggal | |
| 10,720,911 | B2 * | 7/2020 | Shin | H02M 3/073 |
| 10,790,817 | B2 | 9/2020 | Murphy et al. | |
| 10,833,674 | B2 * | 11/2020 | Xu | H03K 17/6872 |
| 11,322,217 | B2 | 5/2022 | Raghunathan et al. | |
| 12,057,857 | B2 * | 8/2024 | Woo | H03M 1/124 |
| 2020/0313667 | A1 | 10/2020 | Sato et al. | |
| 2022/0021381 | A1 * | 1/2022 | Schmidt | H03K 17/063 |
| 2022/0173736 | A1 * | 6/2022 | Garg | H03K 19/01735 |
| 2024/0030812 | A1 | 1/2024 | D'souza | |
| 2024/0213978 | A1 * | 6/2024 | Goyal | G11C 27/024 |
| 2024/0364325 | A1 * | 10/2024 | Sun | H03K 17/162 |

OTHER PUBLICATIONS

Notice of Allowance Issued in European Application No. 24178663.1 dated Jan. 9, 2026 in 28 pages.

* cited by examiner

20

21

22

80

72

Switch Control 71    11    13    12

V_IN    V_OUT

90

2

Switch Control 11a    12a
1a

V_IN+    V_OUT+

11b    12b
1b

V_IN-    V_OUT-

HIGH VOLTAGE TOLERANT BOOTSTRAP SWITCH

CROSS-REFERENCE TO RELATED APPLICATIONS

This application claims the benefit of priority under 35 U.S.C. § 119 of U.S. Provisional Patent Application No. 63/594,169, filed Oct. 30, 2023 and titled "HIGH VOLTAGE TOLERANT BOOTSTRAP SWITCH," which is herein incorporated by reference in its entirety.

FIELD OF THE DISCLOSURE

Embodiments of the invention relate to electronic systems, and more particularly to switches.

BACKGROUND

Switches, such as field-effect transistor (FET) switches, can be used to provide or restrict an electrical path between nodes of an electronic system. As an example, a single FET can be used to generate a low impedance or a high impedance between the source and the drain of the FET in response to an applied control signal at the gate. However, the control signal applied to the FET can cause the FET to leak current under certain signaling conditions. Furthermore, certain operating scenarios can lead to high voltage levels that may damage the FET, such as by causing junction damage and/or gate-oxide damage.

SUMMARY OF THE DISCLOSURE

Apparatus and methods for high voltage tolerant bootstrap switches are disclosed. In certain embodiments, an integrated circuit (IC) includes an input node that receives an input voltage, an output node, and a switch connected between the input node and the output node. The switch includes a first field-effect transistor (FET) and a second FET electrically connected in series between the input node and the output node. The switch is configurable between an OFF state in which a gate of the first FET is controlled with a first voltage and a gate of the second FET is controlled with a second voltage, and an ON state in which the gates of the first FET and the second FET are controlled with a voltage that tracks the input voltage. By implementing the switch in this manner, the switch can achieve both high voltage tolerance in the OFF state and high linearity in the ON state. For example, in the OFF state the switch can withstand large voltage swings at the input node without the FETs of the switch suffering from junction damage and/or gate oxide damage.

In one aspect, an IC includes a first node configured to receive an input voltage, a second node, a switch including a first FET and a second FET electrically connected in series between the first node and the second node, and a switch control circuit configured to set the switch to an OFF state based on controlling a gate of the first FET with a first voltage and a gate of the second FET with a second voltage, and to set the switch to an ON state based on controlling the gate of the first FET and the gate of the second FET to track the input voltage.

In another aspect, a method of switching in an IC includes receiving an input voltage at a first node. The method further includes turning off a switch using a switch control circuit, the switch including a first FET and a second FET electrically connected in series between the first node and the second node, wherein turning off the switch includes setting the switch to an OFF state based on controlling a gate of first FET with a first voltage and a gate of the second FET with a second voltage. The method further includes turning on the switch using the switch control circuit, wherein turning on the switch includes setting the switch to an ON state based on controlling the gate of the first FET and the gate of the second FET to track the input voltage.

In another aspect, a data conversion system includes an input node configured to receive an input voltage, an analog-to-digital converter (ADC) having an input, a switch including a first FET and a second FET electrically connected in series between the input node and the input to the ADC, and a switch control circuit configured to set the switch to an OFF state based on controlling a gate of first FET with a first voltage and a gate of the second FET with a second voltage, and to set the switch to an ON state based on controlling the gate of the first FET and the gate of the second FET to track the input voltage.

DETAILED DESCRIPTION OF EMBODIMENTS

Figure 1:
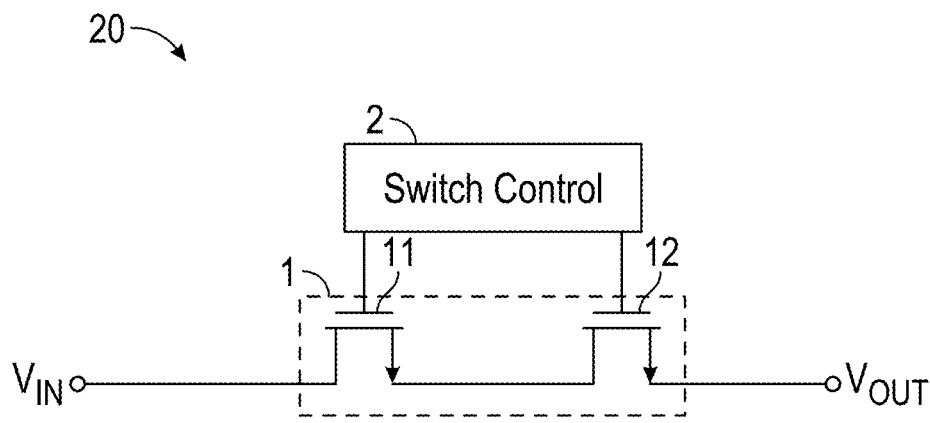
FIG. 1 is a schematic diagram of one embodiment of a high voltage tolerant bootstrap switch.

The following detailed description of embodiments presents various descriptions of specific embodiments of the invention. However, the invention can be embodied in a multitude of different ways. In this description, reference is made to the drawings. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for high voltage tolerant bootstrap switches are disclosed. In certain embodiments, an integrated circuit (IC) includes an input node that receives an input voltage, an output node, and a switch connected between the input node and the output node. The switch includes a first field-effect transistor (FET) and a second FET connected in series between the input node and the output node. The switch is configurable between an OFF state in which a gate of the first FET is controlled with a first voltage and a gate of the second FET is controlled with a second voltage, and an ON state in which the gates of the first FET and the second FET are controlled with a voltage that tracks the input voltage. For example, in the ON state the gates of the first FET and the second FET can be controlled with a voltage corresponding to a sum of the first voltage and the input voltage.

By implementing the switch in this manner, the switch can achieve both high voltage tolerance in the OFF state and high linearity in the ON state. For example, in the OFF state the switch can withstand large voltage swings at the input node without the FETs of the switch suffering from junction damage and/or gate oxide damage.

In certain implementations, the first voltage corresponds to a power supply voltage ($V_{DD}$) of the IC and the second voltage corresponds to a ground voltage ($V_{GND}$) of the IC. Additionally, when in the OFF state the switch can withstand high voltage conditions present at the input node, such as a signal swing between the ground voltage $V_{GND}$ and a second power supply voltage that exceeds $V_{DD}$.

In certain implementations, the input node can correspond to a pin or pad of the IC. An IC is also referred to herein as a semiconductor die. The input pad can be exposed to high voltage conditions when the switch is turned off. In one example, the input pad is a multi-function pin used for two or more IC functions. In such applications, the switch can be turned on and used for a desired function (for instance, sampling) for a first mode and can be turned off and exposed to high voltages in a second mode.

To further enhance tolerance in the OFF state, one or more additional FETs can be included between the first FET and the second FET. For instance, a third FET can be included between the first FET and the second FET with a gate of the third FET controlled in the OFF state by a third voltage that is between the first and second voltages. Furthermore, in the ON state the gates of the first FET, the second FET, and the third FET can be controlled with a voltage corresponding to a sum of the first voltage and the input voltage.

The switch can be used in a wide variety of applications, including in high precision sampling applications in which the switch is specified to operate with low resistance in the ON state. For example, the switch can be used to provide a sampling voltage to an input of an analog-to-digital converter (ADC) in high linearity data conversion applications.

In certain implementations, the gate voltage used for the FETs in the ON state is generated by a switched capacitor circuit, for instance, by a top plate of a bootstrap capacitor.

The FETs can be implemented in a wide variety of ways, including using metal-oxide-semiconductor (MOS) transistors. In certain implementations, the FETs are n-type. However, other implementations are possible. As used herein and as persons having ordinary skill in the art will appreciate, MOS transistors can have gates made out of materials that are not metals, such as polysilicon, and can have dielectric regions implemented not just with silicon oxide, but with other dielectrics, such as high-k dielectrics.

FIG. 1 is a schematic diagram of one embodiment of a high voltage tolerant bootstrap switch 20. The high voltage tolerant bootstrap switch 20 includes a switch 1 and a switch control circuit 2.

As shown in FIG. 1, the switch 1 is connected between an input node that receives an input voltage $V_{IN}$ and an output node that provides an output voltage $V_{OUT}$. In the illustrated embodiment, the switch 1 includes a first n-type field-effect transistor (NFET) 11 and a second NFET 12 electrically connected in series between the input node and the output node. For example, a drain of the first NFET 11 is electrically connected to the input node, a source of the first NFET 11 is electrically connected to a drain of the second NFET 12, and a source of the second NFET 12 is electrically connected to the output node.

The switch control circuit 2 controls the gate voltages of the first NFET 11 and the second NFET 12 to set the switch 1 in either an OFF state or an ON state as desired. In certain implementation, the switch control circuit 2 receives a switch enable signal for setting the state of the switch 1.

In the illustrated embodiment, the switch control circuit 2 sets the switch 1 to an OFF state by controlling a gate of the first NFET 11 with a first voltage and a gate of the second NFET 12 with a second voltage, and sets the switch 1 to an ON state by controlling the gates of the first NFET 11 and the second NFET 12 with a voltage that tracks the input voltage $V_{IN}$. For example, in some implementations the gates of the first NFET 11 and the second NFET 12 can be controlled in the ON state with a voltage corresponding to a sum of the first voltage and the input voltage $V_{IN}$.

By implementing the bootstrap switch 20 in this manner, the bootstrap switch 20 can achieve both high voltage tolerance in the OFF state and high linearity in the ON state. For example, in the OFF state the bootstrap switch 20 can withstand large voltage swings at the input node without the first NFET 11 and second NFET 12 suffering from junction damage and/or gate oxide damage.

In certain implementations, the first voltage corresponds to a power supply voltage of an IC and the second voltage corresponds to a ground voltage of the IC. Additionally, when in the OFF state the bootstrap switch 20 can withstand high voltage conditions present at the input node.

One or more instantiations of the high voltage tolerant bootstrap switch 20 can be fabricated on an IC as desired. Any of the high voltage tolerant bootstrap switches herein can be implemented on an IC.

Figure 2A:
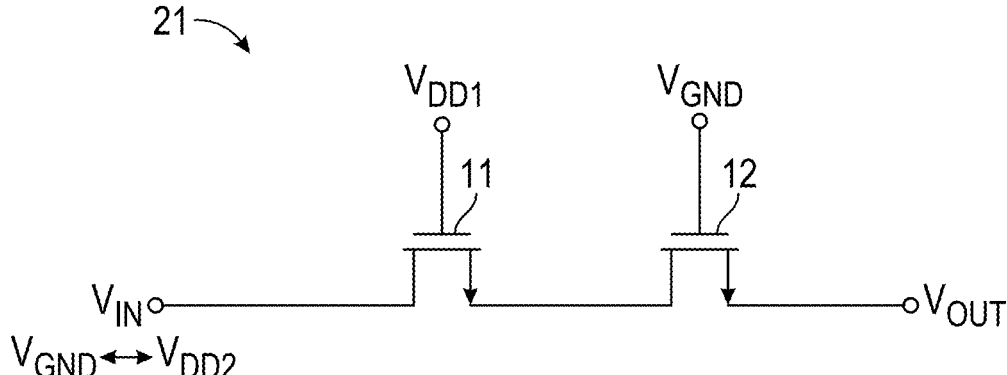
FIG. 2A is a schematic diagram of one example of the high voltage tolerant bootstrap switch of FIG. 1 operating in an OFF state.
Figure 2B:
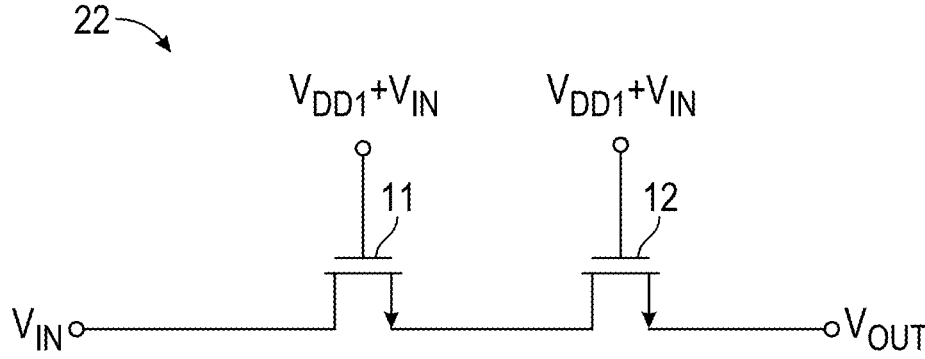
FIG. 2B is a schematic diagram of one example of the high voltage tolerant bootstrap switch of FIG. 1 operating in an ON state.

FIG. 2A is a schematic diagram of one example of the high voltage tolerant bootstrap switch 20 of FIG. 1 operating in an OFF state 21. FIG. 2B is a schematic diagram of one example of the high voltage tolerant bootstrap switch 20 of FIG. 1 operating in an ON state 22.

In the illustrated embodiment, in the OFF state 21 the gate of the first NFET switch 11 is set by the switch control circuit to a first voltage, which in this example corresponds to a first power supply voltage $V_{DD1}$. Additionally, in the OFF state 21 the gate of the second NFET switch 12 is set by the switch control circuit to a second voltage, which in this example corresponds to a ground voltage $V_{GND}$.

By implementing the bootstrap switch in this manner, high voltage tolerance can be achieved in the OFF state 21. For example, the bootstrap switch can withstand a large voltage swing at the input node (for example, the input voltage $V_{IN}$ swinging between the ground voltage $V_{GND}$ and a second power supply voltage $V_{DD2}$, with $V_{DD2} > V_{DD1}$). For example, in the OFF state 21 the bootstrap switch can withstand large voltage swings (including those beyond the first power supply voltage $V_{DD1}$) at the input node without the first NFET 11 and second NFET 12 suffering from junction damage and/or gate oxide damage.

In the illustrated embodiment, in the ON state 22 the gates of the first NFET switch 11 and the second NFET switch 12 are set by the switch control circuit to a voltage that is about equal to a sum of the first power supply voltage $V_{DD1}$ and the input voltage $V_{IN}$.

By implementing the bootstrap switch in this manner, high linearity in the ON state 22 is achieved. For example, as the input voltage $V_{IN}$ changes, the gate voltages of the first NFET switch 11 and the second NFET switch 12 dynamically change in voltage with respect to the input voltage $V_{IN}$ to keep the transistors turned on with low resistance to achieve high linearity.

Figure 3A:
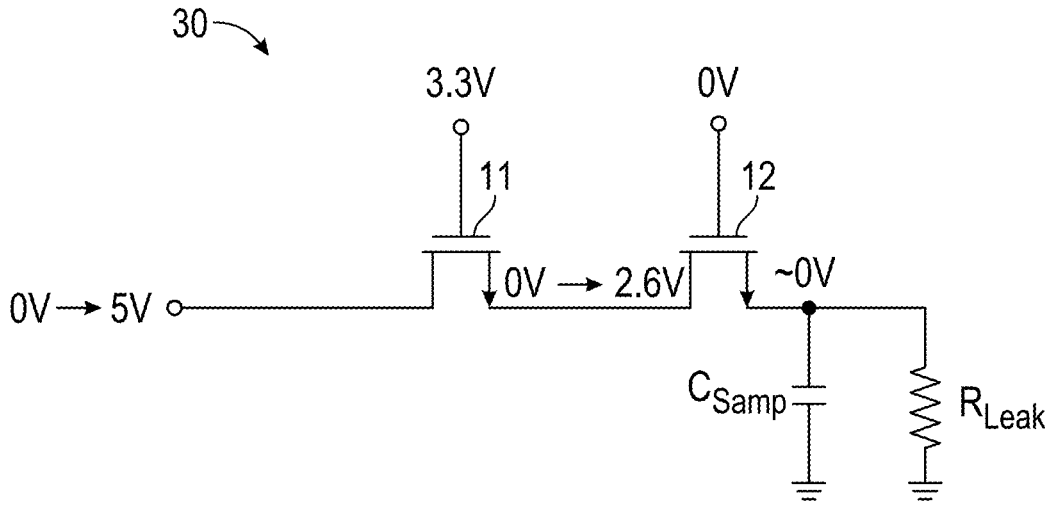
FIG. 3A is a schematic diagram of one example of an OFF state transient simulation for a high voltage tolerant bootstrap switch.

FIG. 3A is a schematic diagram of one example of an OFF state transient simulation for a high voltage tolerant bootstrap switch 30. In this example, the high voltage tolerant bootstrap switch 30 is connected between an input node that swings from 0V to 5V and an output node that is connected to a parallel combination of a sampling capacitor $C_{Samp}$ and a leakage resistor $R_{Leak}$. Additionally, the gate of the first NFET 11 is controlled to 3.3V and the gate of the second NFET 12 is controlled to 0V. In this simulation, the node between the first NFET 11 and the second NFET 12 swings from 0V to 2.6V while the output node maintains a voltage of about 0V.

Figure 3B:
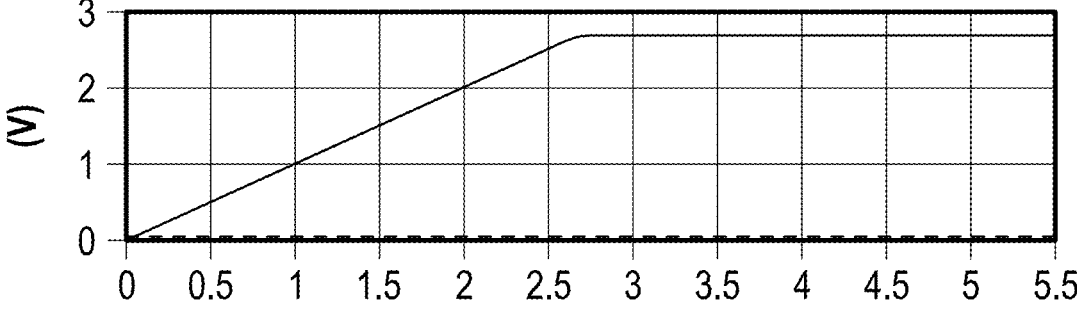
FIG. 3B is one example of a graph of input voltage and input current versus time for the OFF state transient simulation of FIG. 3A.
Figure 3B:
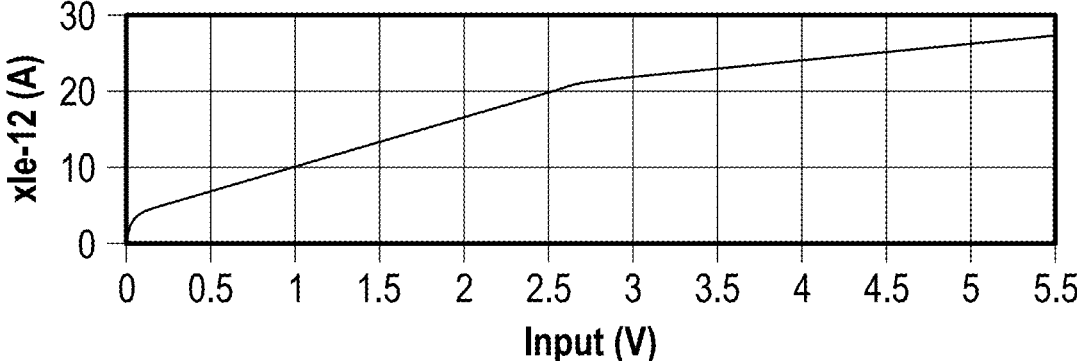

FIG. 3B is one example of a graph of input voltage and input current versus time for the OFF state transient simulation of FIG. 3A. The graph shows that as the input voltage changes from 0V to 5V, the input current maintains an acceptable input current leakage level. Furthermore, in the example of FIG. 3B the transistors are rated to 3.3V, and the graph shows that the drain-to-source voltage (VDS), gate-to-source voltage (VGS), and gate-to-drain voltage (VGD) are all less than 3.3V throughout the transient simulation. Thus, transistor reliability of the switch is maintained.

Figure 4:
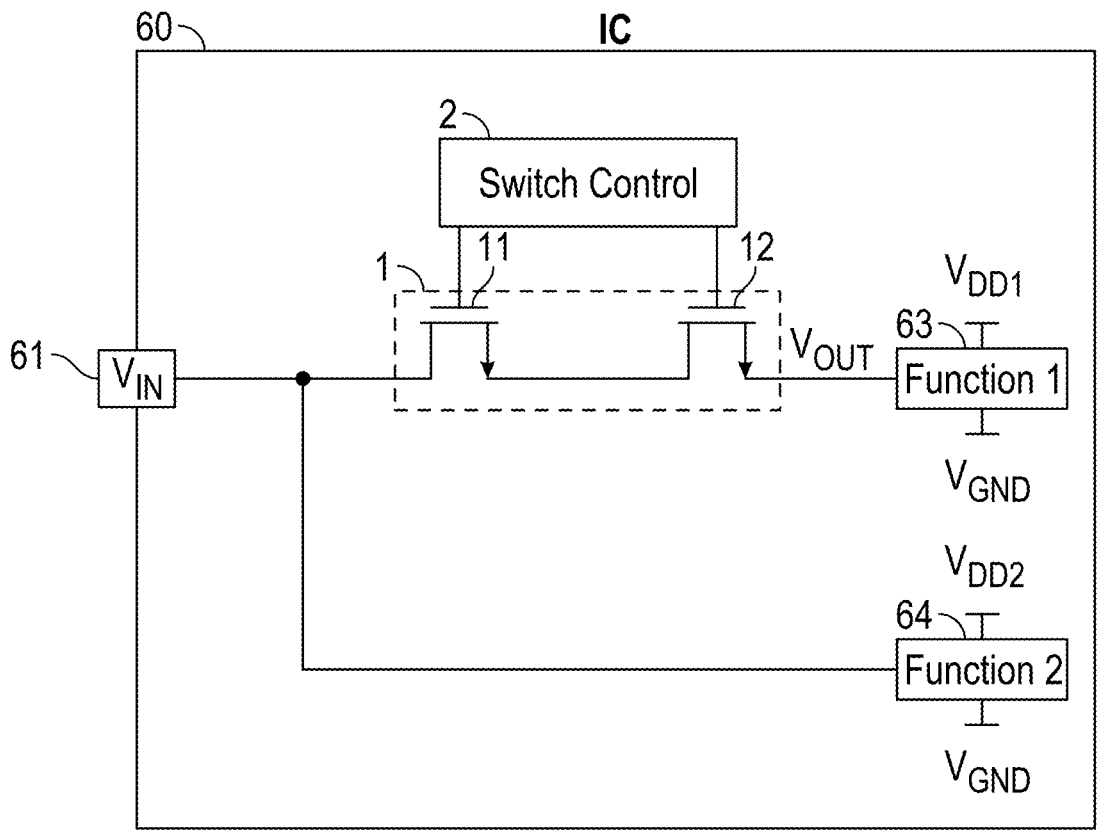
FIG. 4 is a schematic diagram of one embodiment of an integrated circuit (IC) with a high voltage tolerant bootstrap switch coupled to a multi-functional pin.

FIG. 4 is a schematic diagram of one embodiment of an IC 60 with a high voltage tolerant bootstrap switch coupled to a multi-functional pin 61. As shown in FIG. 4, the IC 60 includes a switch 1, a switch control circuit 2, a first functional circuit 63, a second functional circuit 64, and the multi-functional pin 61. Although not shown in FIG. 4 for clarity of the figure, the IC 60 typically includes additional pins and circuitry. In this example, the first functional circuit 63 operates using a first power supply voltage $V_{DD1}$ and a ground voltage $V_{GND}$, while the second functional circuit 64 operates using a second power supply voltage $V_{DD2}$ and the ground voltage $V_{GND}$, where $V_{DD2} > V_{DD1}$.

As shown in FIG. 4, the switch 1 is connected between the multi-functional pin 61 and an output node that is coupled to the first functional circuit 63. Additionally, the switch control circuit 2 sets the switch 1 in an ON state when the first functional circuit 63 is being used and to an OFF state when the second functional circuit 64 is being used.

Since the second functional circuit 64 operates with a higher power supply voltage, the input node of the switch 1 can experience high steady-state voltage levels when the switch 1 is in the OFF state. By implementing the bootstrap switch in accordance with the teachings herein, the bootstrap switch can withstand high voltage conditions present at the multi-functional pin 61 or other input node.

Figure 5:
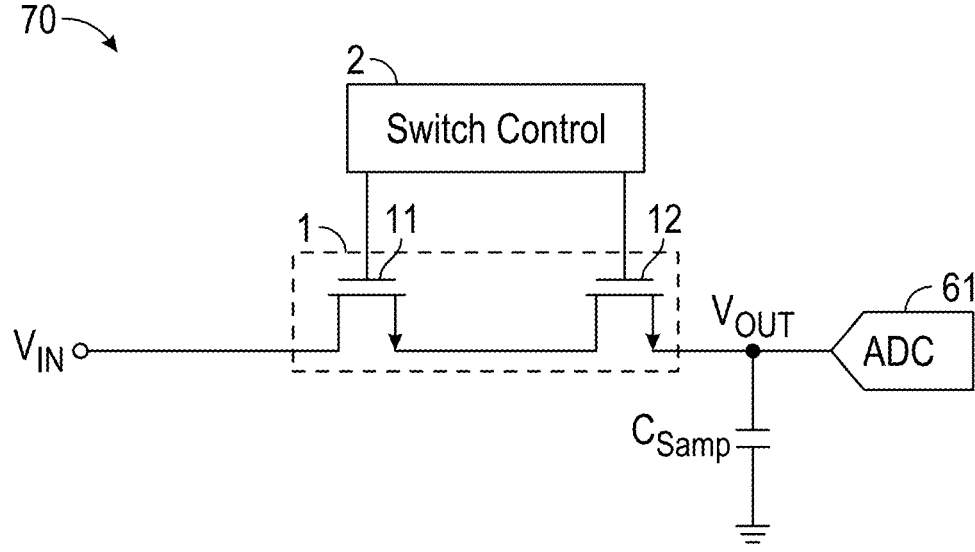
FIG. 5 is a schematic diagram of one embodiment of a data conversion system.

FIG. 5 is a schematic diagram of one embodiment of a data conversion system 70. The data conversion system 70 includes a switch 1, a switch control circuit 2, a sampling capacitor $C_{Samp}$, and an ADC 61.

In the illustrated embodiment, the switch 1 is connected between an input node that receives an input voltage $V_{IN}$ and an output node that provides an output voltage $V_{OUT}$. The sampling capacitor $C_{Samp}$ holds the output voltage $V_{OUT}$.

The input of the ADC 61 is connected to the output node of the switch 1 and serves to generate a digital representation of the output voltage $V_{OUT}$.

The bootstrap switches herein can be used in a wide variety of applications, including data conversion applications. For example, with respect to the embodiment of FIG. 5, the switch 1 can be turned ON or OFF as desired to provide the input voltage $V_{IN}$ to the sampling capacitor $C_{Samp}$ and ADC 61 as desired. When turned ON, the switch 1 provides high linearity. When turned OFF, the switch 1 provides high voltage tolerance including to steady-state high voltage conditions at the input node.

Figure 6:
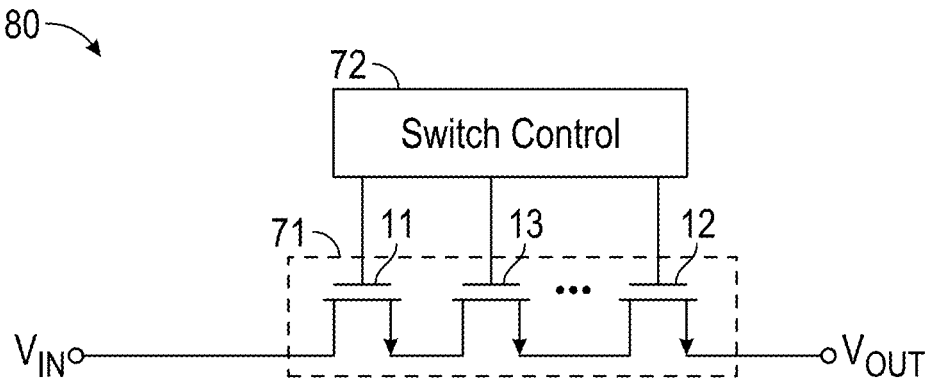
FIG. 6 is a schematic diagram of another embodiment of a high voltage tolerant bootstrap switch.

FIG. 6 is a schematic diagram of another embodiment of a high voltage tolerant bootstrap switch 80. The high voltage tolerant bootstrap switch 80 includes a switch 71 and a switch control circuit 72. The switch 71 includes a first NFET 11, a second NFET 12, and a third NFET 13, which are connected in series between an input node and an output node with the third NFET 13 positioned between the first NFET 11 and the second NFET 12. The gates of the first NFET 11, the second NFET 12, and the third NFET 13 are controlled by the switch control circuit 72 to turn the switch 71 ON or OFF.

The high voltage tolerant bootstrap switch 80 of FIG. 6 is similar to the high voltage tolerant bootstrap switch 20 of FIG. 1, except that the switch 71 of FIG. 6 further includes the third NFET 13 between the first NFET 11 and the second NFET 12.

To further enhance voltage tolerance in the OFF state, one or more additional FETs can be included between the first NFET 11 and the second NFET 12. For instance, this embodiment includes the third NFET 13 between the first NFET 11 and the second NFET 12 with a gate of the third NFET 13 controlled in the OFF state by a third gate voltage that is between the first gate voltage of the first NFET 11 and the second gate voltage of the second NFET 12. Furthermore, in the ON state the gates of the NFETs 11-13 can be controlled to track the input voltage $V_{IN}$, for instance, a voltage corresponding to a sum of the first voltage and the input voltage $V_{IN}$.

Figure 7:
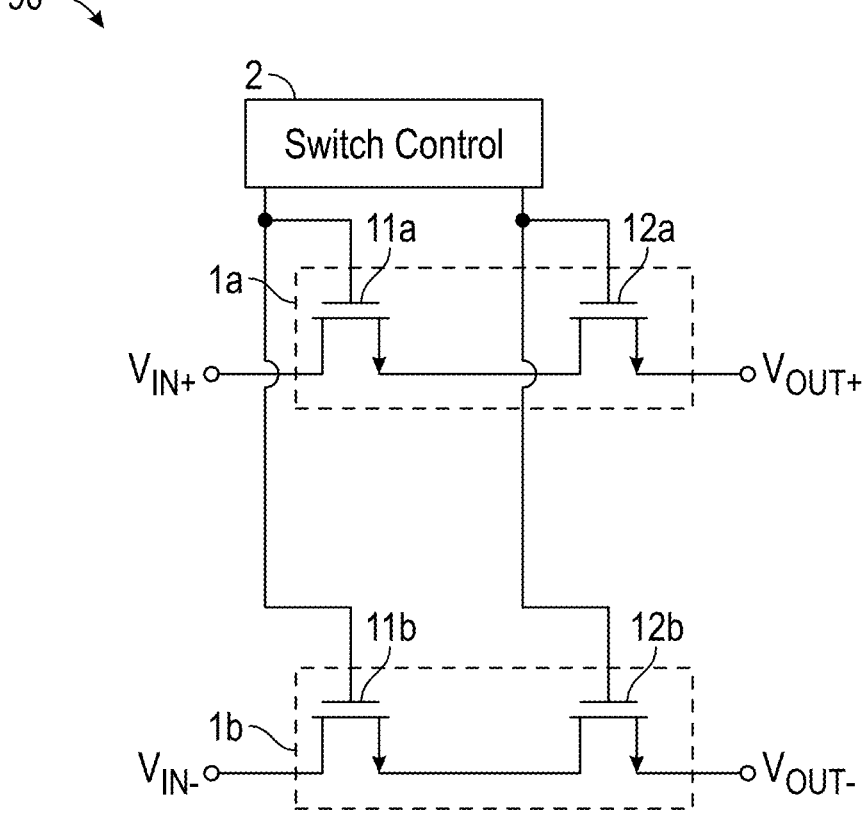
FIG. 7 is a schematic diagram of another embodiment of a high voltage tolerant bootstrap switch.

FIG. 7 is a schematic diagram of another embodiment of a high voltage tolerant bootstrap switch 90. The high voltage tolerant bootstrap switch 90 includes a first switch 1a connected between a first input node that receives a non-inverted input voltage $V_{IN+}$ and a first output node that provides a non-inverted output voltage $V_{OUT+}$, and a second switch 1b connected between a second input node that receives an inverted input voltage $V_{IN-}$ and a second output node that provides an inverted output voltage $V_{OUT-}$.

With continuing reference to FIG. 7, the first switch 1a includes a first NFET 11a and a second NFET 12a electrically connected in series between the first input node and the first output node, while the second switch 1b includes a first NFET 11b and a second NFET 12b electrically connected in series between the second input node and the second output node. The switch control circuit 2 generates a first switch control signal that controls the gate of the first NFET 11a of the first switch 1a and the gate of the first NFET 11b of the second switch 1b, and a second switch control signal that controls the gate of the second NFET 12a of the first switch 1a and the gate of the second NFET 12b of the second switch 1b. The switch control circuit 2 uses the switch control signals to set the switches 1a-1b in the ON state or the OFF state as desired.

The high voltage tolerant bootstrap switch 90 of FIG. 7 is similar to the high voltage tolerant bootstrap switch 20 of FIG. 1, except that the high voltage tolerant bootstrap switch 90 of FIG. 7 is implemented differentially.

Any of the high voltage tolerant bootstrap switches herein can be implemented in a single-ended configuration or in a differential configuration.

Figure 8:
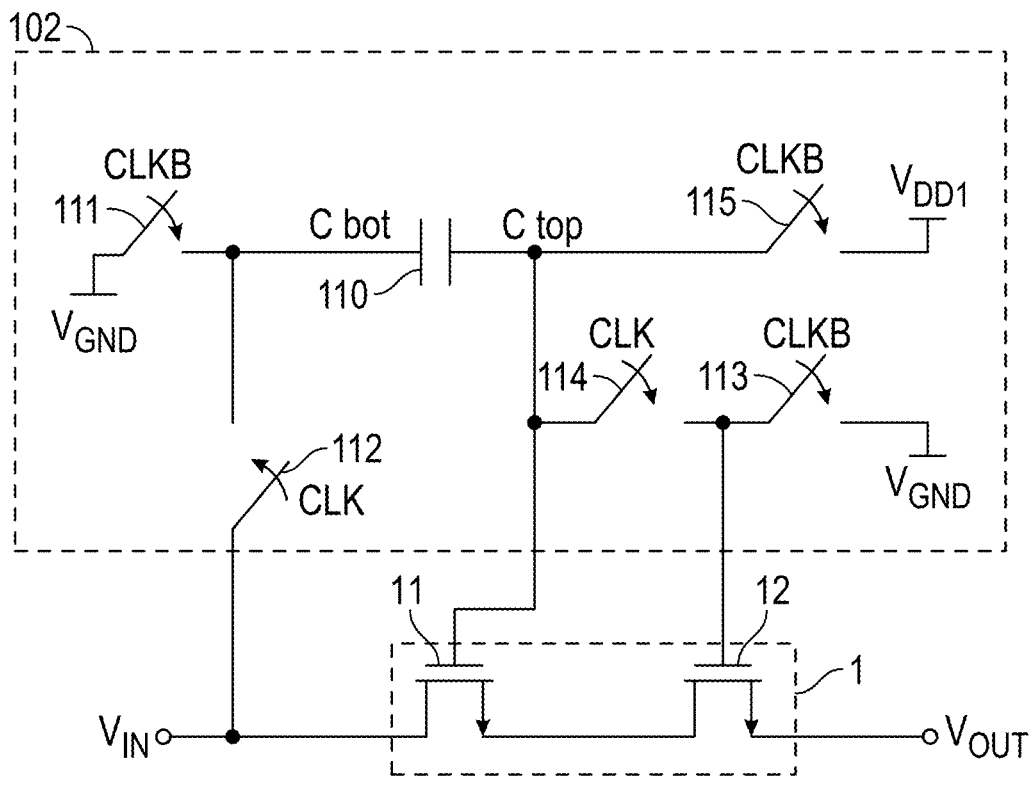
FIG. 8 is a schematic diagram of another embodiment of a high voltage tolerant bootstrap switch.

FIG. 8 is a schematic diagram of another embodiment of a high voltage tolerant bootstrap switch 120. The high voltage tolerant bootstrap switch 120 includes a switch 1 including a first NFET 11 and a second NFET 12 that are in series between an input node that receives an input voltage $V_{IN}$ and an output node that provides an output voltage $V_{OUT}$. The gate voltages of the first NFET 11 and the second NFET 12 are controlled by a positive charge pump 102 that includes a bootstrap capacitor 110, a first control switch 111, a second control switch 112, a third control switch 113, a fourth control switch 114, and a fifth control switch 115.

As shown in FIG. 8, the first control switch 111 is electrically connected between the ground voltage $V_{GND}$ and a bottom plate (cbot) of the bootstrap capacitor 110 and is controlled by an inverted clock signal CLKB. Additionally, the second control switch 112 is electrically connected between the bottom plate of the bootstrap capacitor 110 and the input node and is controlled by a non-inverted clock signal CLK. Furthermore, the third control switch 113 is electrically connected between the ground voltage $V_{GND}$ and a gate of the second NFET 12 and is controlled by the inverted clock signal CLKB. Additionally, the fourth control switch 114 is electrically connected between the gate of the second NFET 12 and a top plate (ctop) of bootstrap capacitor 110 and is controlled by the non-inverted clock signal CLK. Furthermore, the fifth control switch 115 is electrically connected between the power supply voltage $V_{DD1}$ and the top plate of bootstrap capacitor 110 and is controlled by the inverted clock signal CLKB. The gate of the first NFET 11 is electrically connected to the top plate of the bootstrap capacitor 110.

In the illustrated embodiment, the positive charge pump 102 operates in a first phase (with the non-inverted clock signal CLK inactive and the inverted clock signal CLKB active) in which the first control switch 111, the third control switch 113, and the fifth control switch 115 are turned on and the remaining control switches are turned off to control the bottom plate of the bootstrap capacitor 110 to $V_{GND}$, the top plate of the bootstrap capacitor 110 to $V_{DD1}$, the gate of the first NFET 11 to $V_{DD1}$, and the gate of the second NFET 12 to $V_{GND}$. Additionally, the positive charge pump 102 operates in a second phase (with the non-inverted clock signal CLK active and the inverted clock signal CLKB inactive) in which the second control switch 112 and the fourth control switch 114 are turned on and the remaining control switches are turned off to control the bottom plate of the bootstrap capacitor 110 to $V_{IN}$, the top plate of the bootstrap capacitor 110 to $V_{DD1}+V_{IN}$, and the gates of the first NFET 11 and the second NFET 12 to $V_{DD1}+V_{IN}$.

Although FIG. 8 depicts one example implementation of circuitry for controlling the gates of FETs of a switch, the bootstrap switches herein can be controlled in other ways. Accordingly, other implementations are possible.

Figure 9:
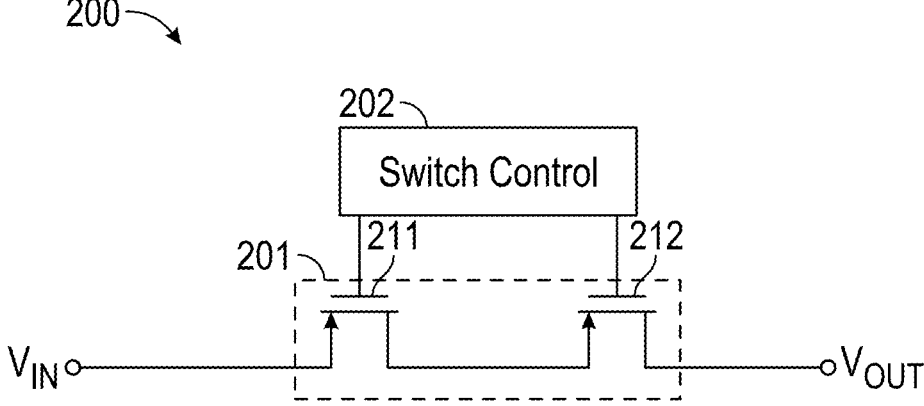
FIG. 9 is a schematic diagram of another embodiment of a high voltage tolerant bootstrap switch.

FIG. 9 is a schematic diagram of another embodiment of a high voltage tolerant bootstrap switch 200. The high voltage tolerant bootstrap switch 200 includes a switch 201 and a switch control circuit 202. The switch 202 is connected between an input node that receives an input voltage $V_{IN}$ and an output node that provides an output voltage $V_{OUT}$.

The high voltage tolerant bootstrap switch 200 of FIG. 9 is similar to the high voltage tolerant bootstrap switch 20 of FIG. 1, except that the high voltage tolerant bootstrap switch 200 of FIG. 9 depicts an implementation using p-type transistors.

For example, as shown in FIG. 9, the switch 201 includes a first p-type field-effect transistor (PFET) 211 and a second PFET 212 electrically connected in series between the input node and the output node. For example, a source of the first PFET 211 is electrically connected to the input node, a drain of the first PFET 211 is electrically connected to a source of the second PFET 212, and a drain of the second PFET 212 is electrically connected to the output node.

The switch control circuit 202 controls the gate voltages of the first PFET 211 and the second PFET 212 to set the switch 201 in either an OFF state or an ON state as desired. For example, the switch control circuit 202 can set the switch 201 to an OFF state by controlling a gate of the first PFET 211 with a first voltage and a gate of the second PFET 212 with a second voltage, and sets the switch 201 to an ON state by controlling the gates of the first PFET 211 and the second PFET 212 with a voltage that tracks the input voltage $V_{IN}$. For example, in some implementations the gates of the first PFET 211 and the second PFET 212 can be controlled in the ON state with a voltage corresponding to a sum of the first voltage and the input voltage $V_{IN}$.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

What is claimed is:

1. An integrated circuit (IC) comprising:

a first node configured to receive an input voltage;

a second node;

a switch including a first field-effect transistor (FET) and a second FET electrically connected in series between the first node and the second node; and a switch control circuit configured to set the switch to an OFF state or an ON state, wherein in the OFF state the switch control circuit is configured to control a gate of the first FET with a first voltage and a gate of the second FET with a second voltage, and wherein in the ON state the switch control circuit is configured to control the gate of the first FET and the gate of the second FET with a control voltage that tracks the input voltage.

2. The IC of claim 1, wherein the first voltage is a supply voltage of the IC.

3. The IC of claim 1, wherein the second voltage is a ground voltage of the IC.

4. The IC of claim 1, wherein the first node is an input pad of the IC.

5. The IC of claim 4, wherein the input pad is multi-functional, the input voltage being in excess of a supply voltage of the IC in the OFF state of the switch.

6. The IC of claim 1, wherein the control voltage is based on a sum of the first voltage and the input voltage.

7. The IC of claim 1, wherein the IC further includes a switched capacitor circuit including a bootstrap capacitor, wherein a first plate of the bootstrap capacitor is configured to control the gates of the first FET and the second FET in the ON state.

8. The IC of claim 7, wherein the bootstrap capacitor is connected between the first voltage and the second voltage in a first state of a clock signal, and between the input voltage and the gates of the first FET and the second FET in a second state of the clock signal.

9. The IC of claim 1, wherein the switch further includes a third FET electrically connected between the first FET and the second FET.

10. The IC of claim 9, wherein in the ON state the switch control circuit is further configured to control the gate of the third FET to track the input voltage.

11. The IC of claim 9, wherein in the OFF state the switch control circuit is further configured to control the gate of the third FET with a third voltage that is between the first voltage and the second voltage.

12. The IC of claim 1, wherein the first FET and the second FET are metal-oxide-semiconductor (MOS) transistors.

13. The IC of claim 1, wherein the first FET and the second FET are n-type transistors.

14. The IC of claim 1, further comprising a sampling capacitor connected to the second node.

15. The IC of claim 1, wherein the switch is implemented using differential signaling.

16. The IC of claim 1, further comprising an analog-to-digital converter (ADC) having an input electrically connected to the second node.

17. A method of switching in an integrated circuit (IC), the method comprising:

receiving an input voltage at a first node;

turning off a switch by setting the switch to an OFF state using a switch control circuit, the switch including a first field-effect transistor (FET) and a second FET electrically connected in series between the first node and the second node, wherein in the OFF state the control circuit controls a gate of first FET with a first voltage and a gate of the second FET with a second voltage; and turning on the switch by setting the switch to an ON state using the switch control circuit, wherein in the ON state the switch control circuit controls the gate of the first FET and the gate of the second FET with a control voltage that tracks the input voltage.

18. The method of claim 17, wherein the control voltage is based on a sum of the first voltage and the input voltage.

19. A data conversion system comprising:

an input node configured to receive an input voltage;

an analog-to-digital converter (ADC) having an input;

a switch including a first field-effect transistor (FET) and a second FET electrically connected in series between the input node and the input to the ADC; and a switch control circuit configured to set the switch to an OFF state or an ON state, wherein in the OFF state the switch control circuit is configured to control a gate of first FET with a first voltage and a gate of the second FET with a second voltage, and wherein in the ON state the switch control circuit is configured to control the gate of the first FET and the gate of the second FET with a control voltage that tracks the input voltage.

20. The data conversion system of claim 19, wherein the control voltage is based on a sum of the first voltage and the input voltage.

* * * * *